(12) United States Patent
Hilpert et al.

(10) Patent No.: US 6,590,769 B2
(45) Date of Patent: Jul. 8, 2003

(54) PURGE AND COOLING SYSTEM FOR ENCLOSURE FOR HAZARDOUS ENVIRONMENT

(75) Inventors: Lee Hilpert, Livingston, TX (US); Gary L. Hensley, Kingwood, TX (US)

(73) Assignee: Hutchison-Hayes International, Inc., Houston, TX (US)

( * ) Notice: Subject to any disclaimer, the term of this patent is extended or adjusted under 35 U.S.C. 154(b) by 0 days.

(21) Appl. No.: 10/116,146

(22) Filed: Apr. 4, 2002

(65) Prior Publication Data
US 2002/0196605 A1 Dec. 26, 2002

Related U.S. Application Data
(60) Provisional application No. 60/300,226, filed on Jun. 22, 2001.

(51) Int. Cl.[7] .................................................. H05K 7/20
(52) U.S. Cl. ....................... 361/695; 361/694; 361/690; 174/15.1; 174/161; 165/104.33; 165/127; 454/184
(58) Field of Search ................................. 361/690–695, 361/696, 689; 174/15.1, 16.1, 16.3; 165/80.3, 104.33, 122; 62/259.2; 454/184

(56) References Cited
U.S. PATENT DOCUMENTS

| | | | | |
|---|---|---|---|---|
| 3,807,383 A | * | 4/1974 | Lawler | ........................ 126/247 |
| 4,665,466 A | * | 5/1987 | Green | ........................ 361/696 |
| 5,101,710 A | | 4/1992 | Baucom | |
| 5,956,228 A | * | 9/1999 | Zahorsky et al. | ............ 361/695 |
| 6,101,090 A | * | 8/2000 | Gates | ........................ 361/690 |
| 6,119,715 A | * | 9/2000 | Russell | ....................... 137/240 |
| 6,304,444 B1 | * | 10/2001 | Combs et al. | ............... 361/695 |
| 6,407,533 B1 | * | 6/2002 | Bartek et al. | ................ 320/150 |
| 6,428,282 B1 | * | 8/2002 | Langley | ......................... 417/2 |

* cited by examiner

*Primary Examiner*—Boris Chervinsky
(74) *Attorney, Agent, or Firm*—Browning Bushman P.C.

(57) ABSTRACT

A purge system develops a positive pressure in an enclosure, with sufficient volumetric air flow to cool the electrical components. The system includes an air inlet hose, with the input into the inlet hose positioned in an unclassified (i.e. safe) area. The inlet hose couples to the suction of an air blower, which may be mounted inside or outside the enclosure, while the discharge of the air blower is inside the enclosure, thereby providing the necessary positive pressure (purge) within the enclosure. The air discharged from the air blower strikes a baffle, which distributes the blowing air throughout the bottom of the enclosure. The distributed air is then drawn into controller cabinets by dedicated cooling fans. A conduit system connects the controller cabinets to take the now heated air from the cabinets to a discharge outside the enclosure. The outlet of the conduit system may include a counter-weighted flapper valve to maintain the pressure within the enclosure.

19 Claims, 2 Drawing Sheets

PURGE AND COOLING SYSTEM FOR ENCLOSURE FOR HAZARDOUS ENVIRONMENT

This application claims the benefit of Provisional U.S. Patent Application Ser. No. 60/300,226, filed Jun. 22, 2001.

FIELD OF THE INVENTION

The present invention relates generally to the field of electrical panel enclosures and, more particularly, to a purge and cooling system for use with an enclosure adapted to contain heat generating electrical components, such as frequency control devices and the like, wherein the purge system provides sufficient volumetric air flow to cool the components, and adapted for use in a hazardous and/or explosive environment.

BACKGROUND OF THE INVENTION

Drilling rigs present a hazardous environment wherein natural gas and other gases from down hole may develop an explosive mixture in the area. The area immediately around the borehole is classified as a Class 1 area, with the highest likelihood of such a hazard. Another annular region, between 10 and 30 feet from the borehole, is classified as a Class 2 area, and the region beyond 30 feet from the borehole is not classified, since this region does not typically present a hazard due to gases from the well.

The National Electrical Manufacturers Association (NEMA) has established standards for electrical components which are adapted to be used in such hazardous areas, such electrical components including frequency control devices for motors operating on and around drilling rigs. For example, Class 1, Division 1, group D dictates standards for enclosures used where natural gas may be present. One aspect of the standard for such enclosures requires a positive pressure within the enclosure of at least 0.5" $H_2O$ pressure. Unfortunately, most enclosures which satisfy this requirement do not provide adequate air flow to cool the heat generating electrical components within the enclosure because the air is stagnant or stationary. To overcome this drawback, many systems further include an air conditioning system to cool the components. Such air conditioning systems must themselves satisfy the enclosure criteria, since they are generally included in the same area. Also, the air conditioning systems require more power, and present a maintenance problem, just as any additional equipment would do.

Known systems which pressurize enclosures having heat generating equipment therein and cooled by air conditioning system suffer from another drawback. Such enclosures with contained air systems with supply from seawater laden air typically develop substantial condensation within the enclosure. This phenomenon can be particularly destructive to electrical components within the enclosure.

Thus, there remains a need for a system which can provide a positive pressure within an enclosure intended for a hazardous environment in order to satisfy NEMA standards, and yet cool the electrical components within the enclosure without the need for an air conditioning system. Such a system should also minimize or even eliminate the tendency of such enclosure cooling systems to develop condensation within the enclosure. The present invention is directed to solving these and other problems in the art.

SUMMARY OF THE INVENTION

The present invention addresses these and other drawbacks in the art by providing a purge system to develop a positive pressure in an electrical enclosure, with sufficient volumetric air flow to cool the electrical components.

The system includes an air inlet hose, with the input into the inlet hose positioned in an unclassified (i.e. safe) area. The inlet hose couples to the suction of an air blower, while the discharge of the air blower is inside the electrical enclosure, thereby providing the necessary positive pressure (purge) within the enclosure. The air blower may be positioned outside the enclosure or, alternatively in a presently preferred embodiment, the air blower may be mounted within the enclosure. The air discharged from the air blower strikes a baffle, which distributes the blowing air throughout the bottom of the enclosure. The distributed air is then preferably drawn into controller cabinets by dedicated cooling fans. A conduit system connects the controller cabinets to take the now heated air from the cabinets to a discharge outside the enclosure. The outlet of the conduit system may include a counter-weighted flapper valve to maintain the pressure within the enclosure.

The volumetric flow rate is preferably sufficient to maintain no more than about a 10° F. temperature rise across the enclosure. Thus, if the components within the enclosure are rated at 130° F., then adequate margin is provided to cool the components even with an ambient temperature above 110° F. or even higher.

The system also includes a feature of a time delay between the time of actuating a start signal to the electrical components within the enclosure and the actual shutting of contactors to start the components. This time delay is for the air blower to get up to speed and pressurize the enclosure to purge pressure before energizing the frequency controllers, for example, in the enclosure.

It is therefore an object of the present invention to provide a system and a method of cooling heat-generating electrical components within an enclosure. It is another object of the invention to cool such electrical components without the need for an air conditioning system comprising a heat pump or compressor using a coolant. It is a further object of the invention to cool electrical components within an enclosure for use within a hazardous environment.

These and other objects and features of the invention will be apparent to those of skill in the art from a review of the following detailed description along with the accompanying drawings.

DETAILED DESCRIPTION OF A PREFERRED EMBODIMENT

Figure 1:
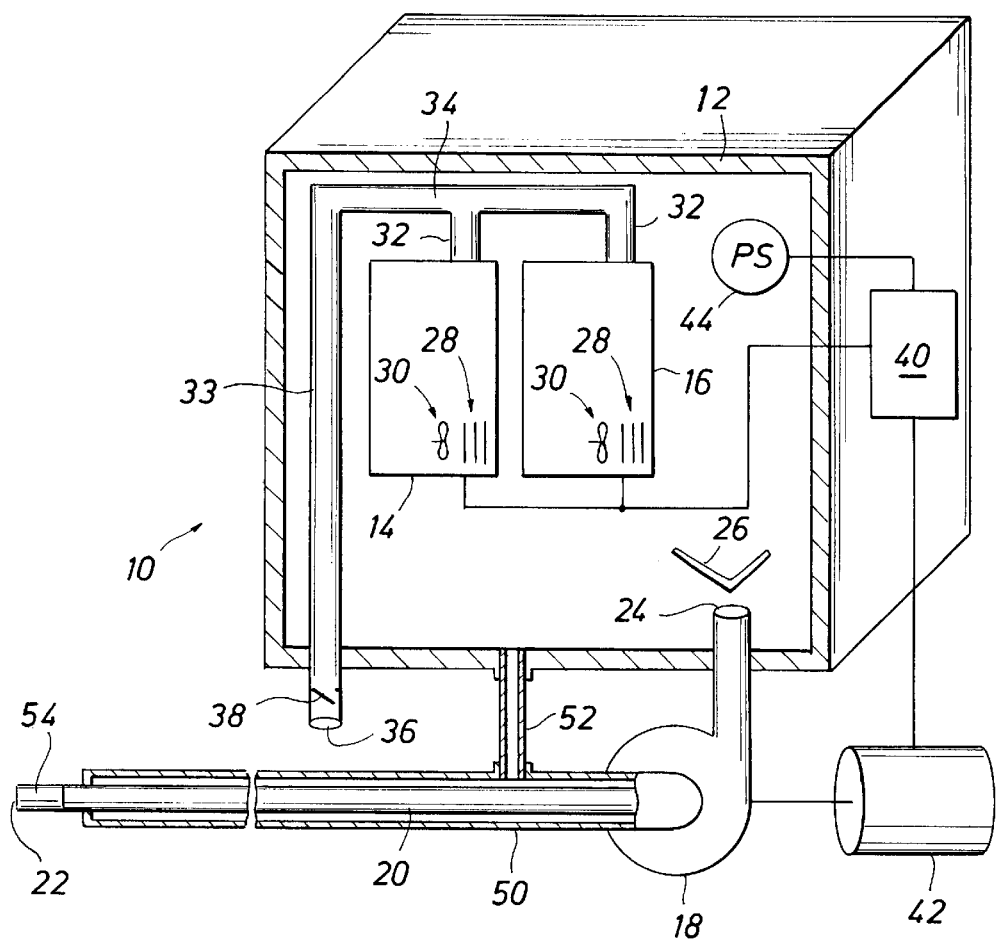
FIG. 1 is an elevational schematic view of the system of the present invention for cooling electrical components contained within an enclosure.

FIG. 1 depicts a schematic diagram of a cooling purge system 10 of the invention. The invention was specifically designed for hazardous environments in and around drilling areas, where explosive gases are common. More particularly, the present invention comprises a self-contained enclosure system specially adapted to mounting on an off-shore rig which may present a hazardous environment.

The system comprises a sealed enclosure 12 which satisfies the NEMA specifications for use in such a hazardous environment. Within the enclosure are one or more heat generating electrical components 14 and 16, such as for example frequency controllers. In a typical system, such heat generating electrical components, when sealed within a specified enclosure, generate so much heat that an air conditioning system is imperative. The present invention eliminates the need for such an air conditioning system, as described below.

To this end, the present invention includes an air blower 18. The blower 18, is not an air compressor, because an air compressor puts out a low volume of air at a substantially higher air pressure, and the compressed air from the compressor is at a higher temperature than at the suction of the air compressor. Rather, the air blower 18 generates a high volume of blowing air at only slightly higher pressure than at the suction of the blower. The air blower 18 is fed from an air supply line 20 which has an inlet end 22 in an unclassified area, at least 30 feet from the center of the hazardous area. The blower 18 includes a discharge end 24 within the enclosure 12 to blow air onto a baffle 26 to thereby distribute the blowing air across the bottom of the enclosure 12. As shown in FIG. 1, the blower may be mounted outside the enclosure 12.

Each of the cabinets 14 and 16 includes an air inlet or opening 28 through the cabinet cover, preferably close to the bottom of the cabinet. Air is drawn into the cabinets through the openings 28 by dedicated fans 30. The total volumetric capacity of all the fans 30 is less than the capacity of the blower 18 to maintain at least 0.5" $H_2O$ of air pressure in the enclosure. The fans assist in directing air across heat generating components within the cabinets.

At the top of each cabinet 14 and 16 is an air outlet 32 which feeds into an air conduit or manifold 34. The manifold terminates at an air discharge 36 outside the enclosure 12. In the embodiment of FIG. 1, near the discharge 36 is an air outlet valve 38 which helps maintain pressure in the enclosure and, when pressure drops the valve 38 shuts keeping extraneous gases out of the enclosure.

Outside the enclosure 12 is a controller panel 40. The controller panel controls electrical power to the components within the cabinets 14 and 16 and a motor 42 which drives the blower 18. Within the enclosure is a pressure switch 44. On startup of the system from the controller panel 40, electrical power is provided to the motor, thereby starting the blower 18, but no power is immediately provided to the components within the cabinets 14 and 16. When the pressure switch 44 senses an adequately positive pressure, then the switch 44 sends a signal to the controller panel 40, permitting electrical power to be provided to the components within the cabinets. This ensures a safe environment within the enclosure prior to any electrical power being provided to any spark producing components within the enclosure.

FIG. 1 depicts yet another safety feature of the invention comprising an overlayer 50. The overlayer, preferably a hard pipe such as PVC, surrounds and encloses the inlet hose 20. The clearance between the overlayer 50 and the inlet hose 20 provides an annulus which is preferably pressurized at the same pressure as that within the enclosure 12 by a conduit 52. This feature eliminates the possibility of drawing hazardous gases into the hose if the hose should develop a leak or a break because the blower 18, in taking a suction on the hose, develops a pressure within the hose at below ambient. Note also that the overlayer 50 preferably seals to the blower 18 in the embodiment of FIG. 1. Finally, the overlayer seals near the end 22 of the hose 20 to expose a filter element 54 which keeps debris from within the inlet hose.

Figure 2:
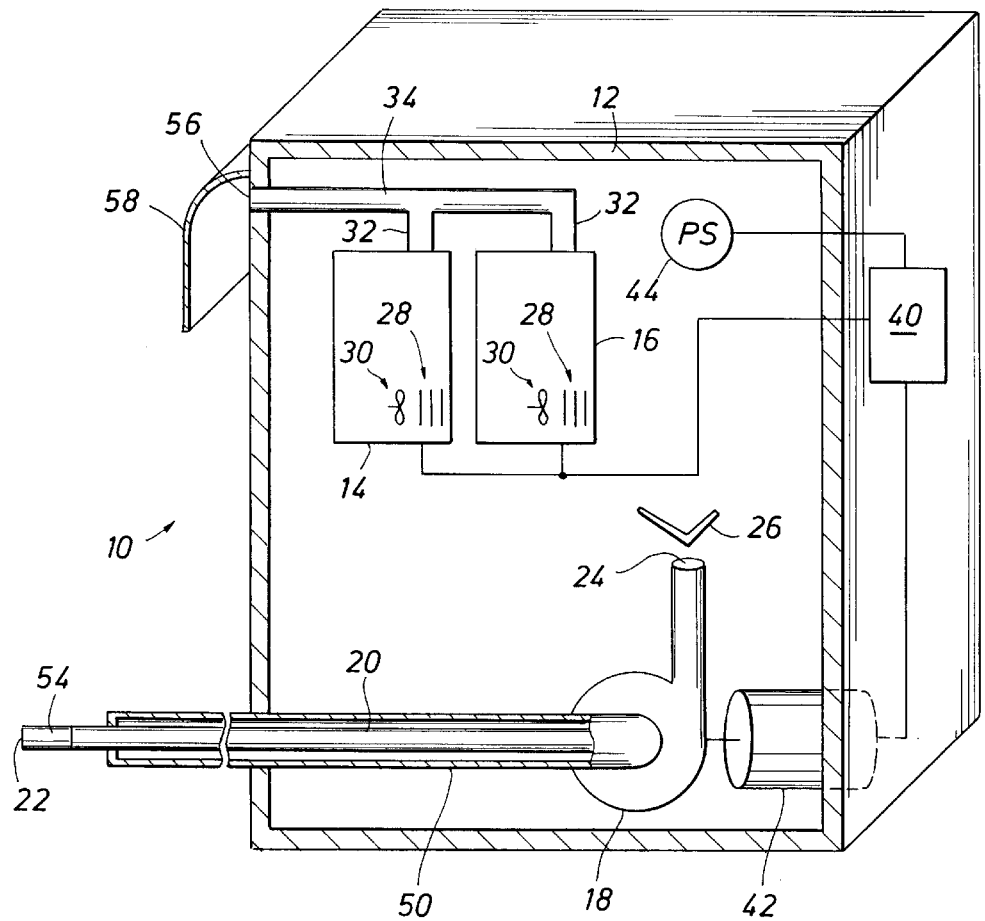
FIG. 2 is an elevational schematic view of a presently preferred embodiment of the invention including an air blower mounted within the enclosure.

FIG. 2 depicts a presently preferred embodiment of the invention wherein like components are number the same as in FIG. 1. The sealed enclosure 12 encloses cabinets 14 and 16 which hold electrical heat-generating components. In the embodiment of FIG. 2, however, the blower 18 is mounted within the enclosure 12. The motor 42 for driving the blower 18 is also mounted within the enclosure. This arrangement provides the advantage in that the invention is therefore a self-contained purge and cooling system which is easily transported to a work site for operation. All that then remains is to provide the working components with electrical power.

In this instance, at the top of each cabinet 14 and 16, the air outlet 32 feeds into an air conduit or manifold 34 which penetrates the enclosure 12 at a vertical wall. This feature eliminates the downward run of conduit to the floor of the enclosure 12 of the embodiment of FIG. 1. The manifold 34 penetrates the vertical wall at a penetration 56, and the penetration is covered on top with an awning or cowling 58. It should also be noted that the air outlet 32 and the manifold 34 maybe eliminated, if desired, in the embodiment illustrated in FIG. 2 since the penetration 56 is positioned high on the vertical wall. The cowling directs the heated air from the enclosure in a downward direction, and keeps debris out of the penetration 56.

The combination of the inlet hose 20 with its overlayer 50 also penetrate a vertical wall of the enclosure, which may be the same or a different vertical wall as that penetrated by the manifold 34. The overlayer 50 still extends to a point close to the end of the hose 20, that is, into an unclassified area. This structure also eliminates the need for the conduit 52 to pressurize the annulus between the hose and its overlayer. The overlayer, however, still provides for an armor covering over the hose to help prevent damage to the hose.

The principles, preferred embodiment, and mode of operation of the present invention have been described in the foregoing specification. This invention is not to be construed as limited to the particular forms disclosed, since these are regarded as illustrative rather than restrictive. Moreover, variations and changes may be made by those skilled in the art without departing from the spirit of the invention.

We claim:

1. A purge cooling system comprising:
   a. a sealed enclosure adapted for use in an explosive environment;
   b. an air inlet into the enclosure;
   c. an air outlet from the enclosure;
   d. at least one cabinet within the enclosure having a heat generating electrical component therein;
   e. an air blower adapted to blow air into the enclosure at a volumetric flow rate sufficient to cool the heat generating electrical components and maintain a positive pressure in the enclosure;
   f. an air inlet line having an end open to the environment in an unclassified area and coupled to the air blower; and
   g. a fan at the at least one cabinet, the fan having a volumetric flow rate of air less than the volumetric flow rate of the blower.

2. The system of claim 1, further comprising an air manifold coupled to the at least one cabinet and coupled to the air outlet.

3. The system of claim 1, further comprising a controller panel outside the enclosure.

4. The system of claim 3, further comprising a motor to drive the blower and wherein the controller panel is electrically coupled to the motor to control the motor.

5. The system of claim 1, wherein the blower is positioned outside the enclosure.

6. The system of claim 1, wherein the blower is positioned within the enclosure.

7. The system of claim 1, wherein the blower defines an air discharge within the enclosure and further comprising a baffle adjacent the air discharge.

8. The system of claim 3, further comprising a pressure switch sensing pressure within the enclosure and providing a pressure signal to the controller panel.

9. The system of claim 8, wherein the pressure switch disables the heat generating electrical component within the at least one cabinet below a predetermined sensed pressure within the enclosure.

10. The system of claim 9, wherein the predetermined sensed pressure is 0.5" $H_2O$.

11. The system of claim 1, wherein the enclosure defines a floor, and wherein the air outlet penetrates the floor.

12. The system of claim 11, further comprising a check valve at the air outlet.

13. The system of claim 1, wherein the enclosure defines a vertical wall, and wherein the air outlet penetrates the vertical wall.

14. The system of claim 13, further comprising a cowling over the air outlet.

15. The system of claim 1, wherein the volumetric flow rate of the air blower is sufficient to cool the electrical component by at least 10° F.

16. The system of claim 1, further comprising an overlayer surrounding the inlet line.

17. The system of claim 16, wherein the overlayer defines an annulus between the overlayer and the inlet line and further comprising a conduit coupling the annulus with the enclosure.

18. A purge cooling system comprising:
a. a sealed enclosure adapted for use in an explosive environment;
b. an air inlet into the enclosure;
c. an air outlet from the enclosure;
d. at least one cabinet within the enclosure having a heat generating electrical component therein;
e. an air blower adapted to blow air into the enclosure at a volumetric flow rate sufficient to cool the heat generating electrical components and maintain a positive pressure in the enclosure;
f. an air inlet line having an end open to the environment in an unclassified area and coupled to the air blower; and
g. an air manifold coupled to the at least one cabinet and coupled to the air outlet.

19. A purge cooling system comprising:
a. a sealed enclosure adapted for use in an explosive environment;
b. an air inlet into the enclosure;
c. an air outlet from the enclosure;
d. at least one cabinet within the enclosure having a heat generating electrical component therein;
e. an air blower adapted to blow air into the enclosure at a volumetric flow rate sufficient to cool the heat generating electrical components and maintain a positive pressure in the enclosure;
f. an air inlet line having an end open to the environment in an unclassified area and coupled to the air blower; and
g. an overlayer surrounding the inlet line.

* * * * *